United States Patent [19]
Bregman et al.

[11] Patent Number: 5,093,879
[45] Date of Patent: Mar. 3, 1992

[54] ELECTRO-OPTICAL CONNECTORS

[75] Inventors: Mark F. Bregman, Ridgefield, Conn.; William D. Brewer, Berlin, Fed. Rep. of Germany; Mitchell S. Cohen, Ossining, N.Y.; Glen W. Johnson, Yorktown Heights, N.Y.; Ismail C. Noyan, Peekskill, N.Y.; Modest M. Oprysko, Mahopac, N.Y.; Mark B. Ritter, Brookfield, Conn.; Dennis L. Rogers, Croton-on-Hudson, N.Y.; Jeanine M. Trewhella, Peekskill, N.Y.

[73] Assignee: International Business Machines Corporation, Armonk, N.Y.

[21] Appl. No.: 542,275

[22] Filed: Jun. 22, 1990

[51] Int. Cl.⁵ .................. G02B 6/32; H01J 5/16; G02F 1/00; H01L 27/10
[52] U.S. Cl. .................. 385/93; 385/54; 385/49; 385/55; 385/89; 250/227.11; 250/551; 357/45; 359/152; 359/154; 359/173
[58] Field of Search .......... 350/96.15, 96.17, 96.18, 350/96.20, 96.21, 96.24, 96.25, 96.31, 320; 250/227.11, 551; 455/602, 606, 607, 617, 610, 612; 357/17, 19, 45, 75, 30

[56] References Cited
U.S. PATENT DOCUMENTS

| 3,573,459 | 4/1971 | Siegmund | 350/96.31 X |
|---|---|---|---|
| 4,022,647 | 5/1977 | Yeuck | 156/182 |
| 4,232,219 | 11/1980 | Yamamoto et al. | 250/227.11 X |
| 4,612,670 | 9/1986 | Henderson | 455/602 X |
| 4,614,873 | 9/1986 | Umeji | 250/227.11 |
| 4,626,878 | 12/1986 | Kuwano et al. | 357/19 |
| 4,776,659 | 10/1988 | Mruk | 350/96.15 |
| 5,028,110 | 7/1991 | Plummer | 350/96.15 |

FOREIGN PATENT DOCUMENTS

| 4120176 | 10/1984 | Fed. Rep. of Germany | 455/602 X |
|---|---|---|---|
| 2489643 | 3/1982 | France | 455/406 X |

OTHER PUBLICATIONS

Glaser et al., "Optcal Interconnections for Digital ...", Optics Lett., 1/86, vol. 11, No. 1, pp. 53-55.
Glaser, "Lenslet Array Processors", Applied Optics, vol. 21, No. 7, pp. 1271-1280.

Primary Examiner—Brian Healy
Attorney, Agent, or Firm—Joseph J. Kaliko; Daniel P. Morris

[57] ABSTRACT

A direct optical connector (DOC) comprised of first and second members, each including a plurality of light emitting and light detecting locations, operative in combination with energy transfer media to form direct optical connections between the light emitting locations and the light detecting locations, wherein said first and second members are adapted for reclosable connection to each other whereupon the light emitting locations on one member are aligned with the light detecting locations on the other member. The first and second members of the preferred DOC are modular. Alternative forms of energy transfer media are used in various embodiments of the invention including lenslet arrays, imaging fiber plates (IFPs), and energy transfer fiber plates (ETFPs). These media have differing alignment criteria, differing degrees of immunity from crosstalk, differing degrees of transfer efficiency, different manufacturing costs, etc., thereby permitting the fabrication and/or use of a connector most suited to meet the requirements of a particular application.

A modular half of a DOC can be used in conjunction with a remote optical connector (ROC) to channel light over relatively long distances. The invention also encompasses processes for fabricating ROCs.

40 Claims, 4 Drawing Sheets

ELECTRO-OPTICAL CONNECTORS

BACKGROUND OF THE INVENTION

1. Field of the Invention

The invention relates generally to electro-optical connectors. More particularly, the invention relates to new interconnect structures, and techniques for fabricating these structures, which channel light from a plurality of light emitting locations to a plurality of light detecting locations, using one of several different energy transfer media for purposes of electronic data communication. The alternate embodiments of the energy transfer media have differing alignment criteria for the light sources, detectors and the media itself, provide differing amounts of immunity to crosstalk, immunity to transmissions losses, etc., which allow particular media to be chosen based on application requirements.

2. Description of the Related Art

Increasing input-output count requirements have produced demands for connectors which require less area, offer reduced Electromagnetic Interference (EMI), are reliable and inexpensive. Different applications for the connectors also require supporting a variety of differing data rates, acceptable transmission loss criteria, levels of immunity to crosstalk, etc.

It is becoming increasingly difficult to meet these demands using conventional pin-in-hole connectors, where contact to adjacent contact spacings of less than 50 to 100 mils are hard to achieve.

Furthermore, electromechanical connectors require a high contact force in order to break through the metal oxide on the connector surface. Where high-density interconnections are needed this contact force requirement becomes a serious problem whose solution requires the application of pressure to each pin of the connector through mechanical or hydraulic devices which transmit the requisite force to each of the connector pins. This greatly increases the size, complexity and cost of the interconnect.

In addition to these physical constraints, the electrical characteristics of pin-in-hole connectors produce undesirable side effects. In particular, self-inductance and parasitic capacitances between the various pins in the connector are problems. The inductances associated with these connectors broadcast electromagnetic waves, thus causing EMI which is known to vary in magnitude as Ldi/dt, where L is the inductance of the connector and di/dt is the rate of change of the current through the connector over time.

It has long been known that EMI associated with the inductance of these connectors will grow much worse as the clock rates of very large scale integrated (VLSI) devices (hence di/dt) increase. As it is already difficult to meet FCC standards with current levels of EMI, this problem will become quite serious as added burdens are placed on conventional pin-in-hole technology.

Still further, the aforementioned capacitances, which exist between different pins on a typical connector, cause electrical crosstalk, i.e., the mixing of the signals on one pin of the connector with the signals on other pins of the connector. This capacitively coupled crosstalk is exacerbated as clock rates increase, which is another key concern for future VLSI designs.

Electro-optical solutions to these problems would offer considerably greater contact density at relatively low cost. Low EMI is an inherent characteristic of optical coupling which will reduce noise. Contact force requirements associated with electromechanical connectors could be eliminated. Various levels of crosstalk immunity could be achieved as a function of the particular energy transfer media used to couple to the light emitting and light detecting locations, etc.

Accordingly, it would be desirable to be able to use electro-optical connectors employing energy transfer media (e.g., light imaging elements) most suited to the alignment constraints, density, crosstalk immunity, speed, transmission efficiency, etc. of a given application.

Furthermore, it would be desirable to be able to employ electro-optical connectors using the aforementioned energy transfer media for both direct optical connections, i.e., over short distances of, for example, on the order of approximately 1 cm; and for remote optical connections over relatively long distances, for example, several meters or more.

Still further, it would be desirable to be able to construct and utilize flexible fiber bundles for carrying optical signals betwen remote locations, where the individual fibers of a bundle can be easily aligned and attached to whatever light imaging element is used in the electro-optical connector.

SUMMARY OF THE INVENTION

It is an object of the invention to provide electro-optical connectors which accommodate high density applications, i.e., input-output densities not readily achievable utilizing conventional pin-in-hole connector technology.

It is a further object of the invention to provide alternate energy transfer media for use in the aforementioned electro-optical connectors to accommodate a wide range of alignment requirements, crosstalk immunity requirements, etc., depending on the needs of the application in which the connectors (and media) are to be used.

It is still a further object of the invention to provide both direct and remote optical connectors which utilize the various connector and media type combinations taught herein and to provide both methods and apparatus for fabricating the contemplated connectors.

According to a preferred embodiment of the invention, the interconnect structure for a direct optical connector (DOC), for making optical connections over relatively short distances (e.g., 1 cm or less), comprises a first and second member, each having a plurality of light emitting and light detecting locations. Each member operates in combination with an energy-transfer medium, i.e., means for channelling light from the light emitting locations to the light detecting locations, where the first and second members are adapted for reclosable connection to each other and where the light emitting locations on one member are substantially aligned with the light detecting locations on the other member. The aforementioned first and second members of the preferred DOC are modular.

According to another aspect of the invention, a modular half of the interconnect structure (DOC) outlined hereinabove, can be used in conjunction with other structures which permit light to be channeled over relatively long distances, e.g., several meters or more. An example of such other structures includes a flexible fiber bundle and means for coupling the bundle to a modular half of a DOC. These other structures are referred to hereinafter as remote optical connectors (ROCs).

Furthermore, according to alternative, illustrative embodiments of the invention set forth hereinafter, the energy transfer media employed in a DOC (or modular half of a DOC) is either (1) a lenslet array (with air as the propagation medium), (2) an imaging fiber plate (IFP), consisting of small (approximately 3-10 micrometers in diameter) optical fibers, or (3) an energy-transfer fiber plate (ETFP), comprised of appropriately spaced waveguides of cross section size commensurate with those of the LEDs and detector areas, which although requiring alignment of the intermediate energy transfer medium may allow higher transfer efficiency and will assure freedom from crosstalk.

A detailed discussion of the relative merit of utilizing each of the aforementioned media in a DOC and/or DOC-ROC combination, will be set forth hereinafter. Those skilled in the art will readily appreciate that each of these media have differing alignment criteria, differing degrees of immunity from crosstalk, differing degrees of transfer efficiency, manufacturing cost differences, etc., which allow the designer to fabricate and/or use the connector most suited to meet a particular application need.

Still further, according to the invention, processes for fabricating ROCs are set forth. One process calls for making a ROC out of a flexible array of fibers which is held rigidly at each end of the bundle by, for example, an endplate. The process involves aligning of the array of fibers with the light emitting and light detecting locations in the connectors mating with each of the ROC. The process comprises the steps of (1) punching an endplate for the ROC to provide locating holes into which the fibers can be inserted; (2) inserting the fibers into the locating holes; and (3) holding the fibers in place to form an endplate where the fibers are aligned with the light emitting and light detecting locations in the device to which the ROC is to be connected.

The ROC can be made flexible by suitably packaging the fibers, e.g., in a polymeric sleeve, after assembly of the endplates.

The invention features a variety of electro-optical connections that are suitable for a variety of applications, e.g., connections for applications which can tolerate having to align the imaging elements to obtain virtually no crosstalk; applications where alignment of the imaging element cannot be tolerated, etc. The invention also features an easy to use method for fabricating ROCs for use in conjunction with any of the modular DOCs described herein.

It is noted that it is necessary to transmit DC power across the interfaces of most conventional pin-in-hole electronic connectors, in addition to the electronic data communication which is also carried by such connectors. The DOCs and ROCs discussed hereinafter are designed to carry electronic data and not power, but it is obvious to those skilled in the art that these DOCs and ROCs can also contain conventional metal conductors in addition to their optical pathways, so that DC power can be transmitted also, and that the normal plugging and unplugging operation can be carried out as usual.

The aforestated and other objects and features of the present invention, and the manner of obtaining them, will become apparent to those skilled in the art, and the invention itself will be best understood by reference to the following detailed description read in conjunction with the accompanying Drawing.

DETAILED DESCRIPTION

As indicated hereinbefore, EMI and crosstalk problems arise from the electrical characteristics of pin-in-hole and edge card connectors, namely self-inductance and parasitic capacitances between the various pins in the connector.

Figure 1:
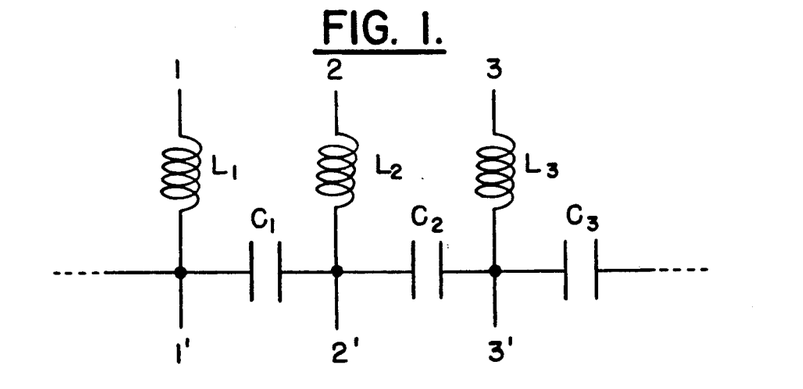
FIG. 1 illustrates the inductance (L) and capacitance (C) associated with pin-in-hole and edge card connectors (electromechanical connectors) which give rise to both EMI and crosstalk.

FIG. 1 illustrates the inductance (L) and the capacitance (C) associated with a series of pins, where the pins are labeled 1, 2 and 3, and their respective mating pins are labeled 1', 2', and 3'. An electromechanical connector is depicted in FIG. 1 in the form of an equivalent circuit where L1, L2, L3 and C1, C2, C3, are the respective inductances and capacitances associated with the series of pins shown.

The inductances associated with electromechanical connectors of the type depicted in FIG. 1 broadcast EMI which, as indicated hereinbefore, intensifies as the clock rate of a device (e.g., a VSLI device) increases. The capacitances cause electrical crosstalk.

The mechanical force problems described hereinbefore compound the problems associated with electromechanical connectors.

According to the invention, one solution to these problems is to replace these mechanical connectors with optical transmitter-receiver pairs, thereby eliminating the inductance, capacitance, and mechanical force problems.

Figure 2:
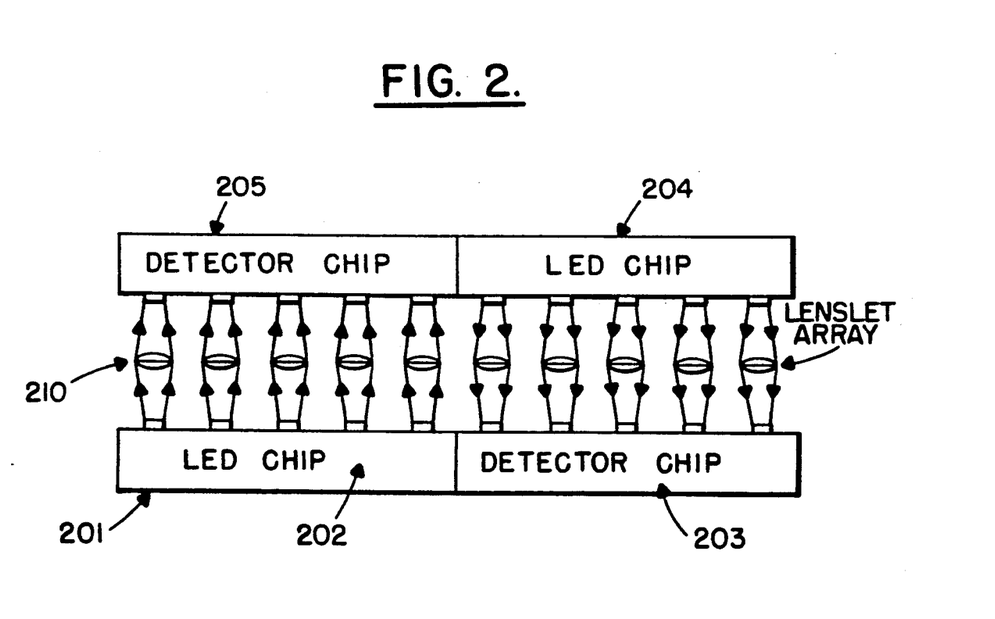
FIG. 2 depicts a generalized layout for one embodiment of the invention wherein a direct optical connector (DOC) is shown using a lenslet array as an energy transfer medium.

FIG. 2 depicts a generalized layout for one embodiment of the invention wherein a two part direct optical connector (DOC) is shown comprising juxtaposed LEDs, lenslets and detectors. These components are aligned in the connector so that an optical communications channel is formed by each associated LED, lenslet, and detector. Light from each LED is efficiently imaged on a corresponding detector via a lenslet; the propagation medium is simply air in the depicted DOC.

For the sake of illustration only, the DOC contemplated by the invention will be explained in terms of card-to-board interconnections. Those skilled in the art will readily appreciate that other applications for DOCs exist, e.g., for smart cards, for module-to-board interconnections, etc., and that the illustrative description is not meant in any way to limit the scope or spirit of the invention.

Referring again to FIG. 2, the bottom half of the novel connector, labeled 201, can, according to the illustrative embodiment of the invention, be mounted on a board. Connector half 201 is shown to contain LED chip 202 and detector chip 203 for respectively transmitting and receiving data. The top half of the detector which, for example, can be mounted on a card, contains chips 204 and 205 that are identical to chips 202 and 203 respectively. However, the chips ar switched in position so as to form the depicted receive and transmit pairs.

Interposed between the LED-detector pairs is a lenslet array, array 210, designed to focus light emitted from the LED onto the appropriate detector. Lenslet array 210 acts not only to increase optical transmission efficiency, but also serves to limit the large beam spread of each LED so that interchannel crosstalk is suppressed. In an embodiment further refined to more strongly suppress crosstalk, e.g., stray light, suitably constructed, and possibly multiple, aperture arrays are included in the structure between the LED, and/or between (212) the lenslet pair.

Upon unplugging the DOC, the lenslet array may be carried by either the upper or lower half of the connector. Alternatively, according to a preferred embodiment of the invention, the imaging component may consist of two lenslet arrays, each of which is carried by a connector half. This later arrangment would facilitate the manufacturing of modular connector halves. Furthermore, it is noted that the lenslet arrays act to protect the delicate transmitting and receiving chips from damage by external forces, and also to complete a hermetic seal to protect the chips from the ambient atmosphere.

The LED arrays depicted in FIG 2 (on chips 202 and 204) can be fabricated using high output-power, high speed, reliable LEDs which are commercially available. For example, LED arrays are typically used in the field of printheads designed for electrophotographic (EP) printing. One embodiment of the invention contemplates utilizing GaAs LED array devices which are reliable and inexpensive.

The lenslets themselves should be designed to provide the maximum efficiency of transfer of light from the LEDs to the detectors. Assuming that the LED is an ideal Lambertian source, the fraction n of its emitted power which is accepted into a lenslet and imaged on a detector is governed by the numerical aperture of the lenslet according to the approximate formula: $n = (NA)^2$.

The lenslets in the array should thus have the highest practical NA values. In addition they should be as aberration free as possible, have nearly identical characteristics, and be accurately positioned. The matrix between the lenslets should be opaque and reflections at interfaces should be minimized in order to reduce interchannel crosstalk.

Several different techniques for making lenslet arrays are known. Polymer sheets have been embossed or molded to form lenslet arrays. The most widely used lenslet arrays designed for EP applications involve graded index (GRIN) lenslets in glass. An alternative proposal is based on the transition upon heating of an array of small, lithographically defined photoresist cylinders into hemispheres (because of surface tension effects). Still another approach involves the use of phase reversal Fresnel zone plates which are also lithographically defined.

Lenslet arrays made using a recently developed photolytic technique have been found to exhibit good quality for DOC applications. The aforementioned photolytic technique is described in volume 24, pp 2520–2525 of Applied Optics (1985) and volume 27, pp 476–479 of Applied Optics (1988). These publications are hereby incorporated by reference.

According to the photolytic technique for making a lenslet array, photosensitive glass is exposed to light in the area outside the regions corresponding to the lenslets. The glass is then heated, which causes physical contraction of the exposed area and corresponding expansion of the unexposed (lenslet) regions; surface tension defines the lenslet shape. This process also renders the matrix region outside of the lenslets opaque, thereby helping to reduce interchannel crosstalk.

The NA of such lenslets is limited by the radius of curvature attainable by the fabrication process. To improve the effective NA, a doublet array may be used. Such an array is commercially available from Corning Glass Works and consists of two plano-convex lenslet arrays with their planar sides cemented together. Such a lenslet array is particularly useful for the DOC, since the object (LED) and image (detector) are about the same size so that 1:1 imaging may be used. in that case the LED and detector are each placed a focal length away from opposite faces of the lenslet array. The light emerging from the doublet half adjacent to the LED is thereby collimated, then enters the doublet half adjacent to the detector where it is refocused.

Figure 3:
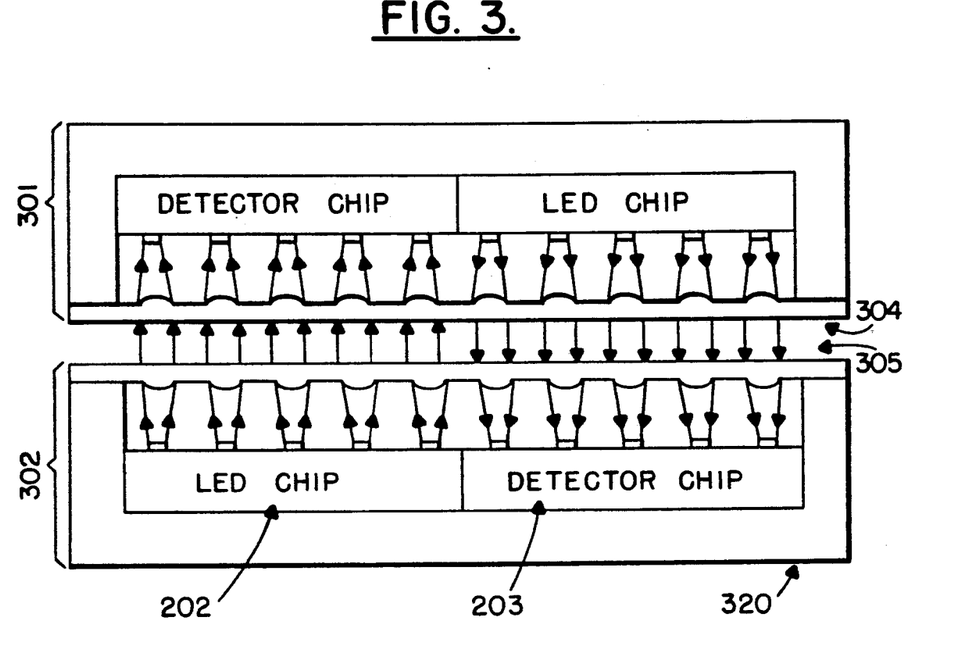
FIG. 3 depicts the top and bottom half of a DOC of the type laid out in FIG. 2, where each half of the DOC is bonded to one of two plano-convex lenslet arrays of a lenslet doublet. The plane of separation of the DOC during unplugging is the interface between the arrays.

According to a preferred embodiment of the invention suggested hereinbefore (i.e., an embodiment where each half of the DOC carries a lenslet array), such a doublet may be advantageously used for the DOC if the two lenslet arrays are left uncemented as shown in FIG. 3. Here both the top and bottom halves of the DOC, shown as 301 and 302 respectively, are each bonded to lenslet arrays 304 and 305 respectively, so that the plane of separation of the DOC during unplugging is the interface between the two arrays. This symmetric arrangement is advantageous because; (1) hermetic sealing is provided by the lenslet arrays themselves, without necessitating another component; (2) the effects of misalignment of the two halves of the connector during replugging are minimized because such misalignment will not cause a displacement of the image of the LED, but will merely result in vignetting (which is explained in more detail hereinafter with reference to FIG. 4); (3) the diameter of the light bundle at the separation plane of the DOC is larger than that given by other arrangements, thereby minimizing the signal reducing effects of dust accumulations on the exposed DOC sufrace; and (4) the symmetric arrangement gives complete modularity to the two DOC halves, and hence results in a lower total cost.

FIG. 3 goes on to show that, according to a preferred embodiment of the invention, each modular half of The DOC comprises, a support, e.g., support 320; a detector chip, e.g., chip 203; and LED chip, e.g., chip 202; and half of a doublet lenslet array, like array 305. The gap between the halves depicted in FIG. 3 is exaggerated to show the plane of separation between the modular units.

Lenslets 304 and 305 of FIG. 3 must be aligned to each other and to the light emitting and detecting elements in order for the DOC to operate properly. A DOC of the type depicted in FIG. 3 effectively requires a three stage alignment process, i.e., aligning the lenslets to each other and to the emitting and detecting elements. This procedure can be reduced to a one stage process in an alternative embodiment of the invention to be described hereinafter. It will be seen, with reference to this alternative embodiment (wherein the lenslet arrays are replaced with IFPs) that the energy transfer media (the IFPs) do not have to be aligned to obtain a functional connector.

In order to improve packing density and reduce cost of the DOC depicted in FIG. 3, it is desirable to integrate the detector and a preamplifier to form a "receiver" array. An additional benefit of such integration is high noise immunity at the detector-preamplifier circuit. This integration has been achieved using GaAs MESFET technology with very little modification of the basic MESFET process as described in volume 7 of Electron Device Letters, pp 600-602 (1986) and in the proceedings of the Picosecond Electronics Optoelectronics Conference, p 116 (1987). These publications are hereby incorporated by reference.

As for channel spacing, the connector pitch currently achievable using a lenslet array is approximately 250 micrometers. However, as the pitch deceases the potential for crosstalk increases. For lenslets with a Numerical Aperture (NA) of 0.2 used with a detector 70 micrometers wide, a pitch on the order of 500 micrometers is required to reduce optical crosstalk to an acceptable level. Crosstalk potential also increases with higher throughput lenses. Obviously, many different arrays can be constructed to meet specific application needs. For exmaple, achieving a 200-250 micron period in the arrays to allow an interface with standard optical fibers for remote connectors, is possible with a level of crosstalk that is acceptable for many applications.

Good alignment of the DOC is also required for producing an adequate signal. The alignment requirements can be met both in the manufacture and operation of the DOC assuming the use of the embodiment of the invention discussed hereinabove with reference to FIG. 3. Only a 5% loss in signal is suffered when the LED is translated 25 micrometers with respect to the lenslet; LED-to-lenslet array and lenslet array-to-receiver alignment, to within plus or minus 25 micron tolerance, can be achieved utilizing present day manufacturing techniques. Alignment by the user (plugging) to within the same tolerance can be realized with the aid of appropriate insertion-guide pins. In this case misalignment within a plus or minus 25 micron tolerance should result in loss of signal no greater than 10-15%, based on the vignetting concept explained immediately hereinafter with reference to FIG. 4A and 4B.

Figure 4A:
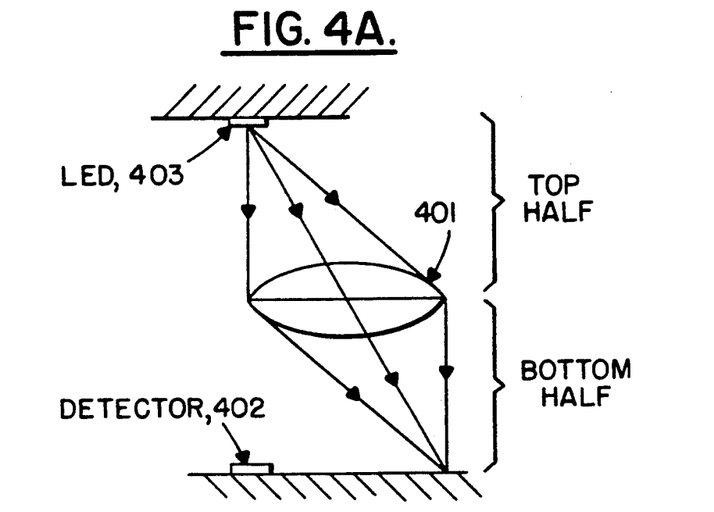
FIGS. 4A and 4B illustrate the misalignment tolerance of a symmetric DOC having half of a lenslet doublet bonded to each connector half.
Figure 4B:
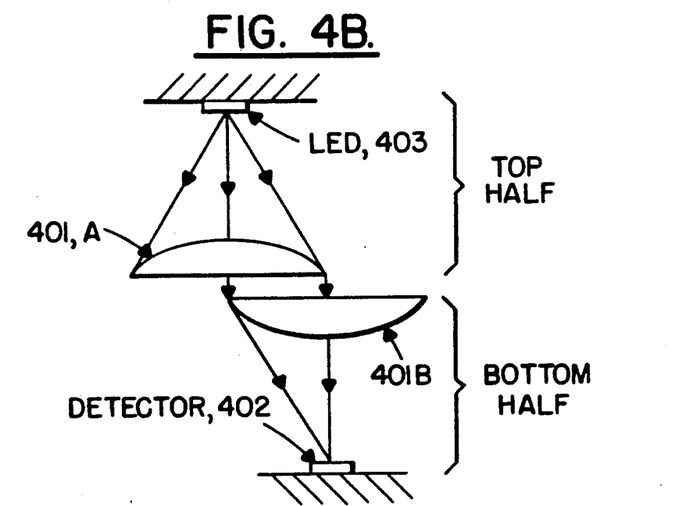

FIGS. 4A and 4B depict the misalignment tolerance of a symmetric DOC with half of a lenslet doublet bonded to each connector half, compared with the misalignment tolerance of embodiments of the invention having a lenslet totally attached to one half (e.g., the bottom half) of a DOC.

In FIG. 4A, lenslet doublet 401 is shown attached to the bottom half of a DOC. Detector 402, also on the bottom half of the DOC, is also depicted in FIG. 4A. Detector 402 does not receive any of the light from LED 403 located on the top half of the DOC. This is because the top and bottom half of the DOC are misaligned.

In FIG. 4B, however, the same misalignment between the two halves of the DOC exists and the effects of vignetting can be observed. The connector in FIG. 4B. is able to channel light from the LED to the detector. The net result is increased misalignment tolerance using the approach depicted in FIG. 4B (half of a lenslet doublet, depicted as 401a and 401b in FIG. 4B, bonded to each connector half) versus the approach depicted in FIG. 4A.

Since each half of the preferred DOC shown in FIG. 3 is identical, advantage may be taken of this modularity to make a remote optical connector (ROC). As indicated hereinbefore, the ROC is a fiber optic connector which, if desired, may be plunged into a DOC half to facilitate making a remote interconnection when needed. This is illustrated in FIG. 5.

Figure 5:
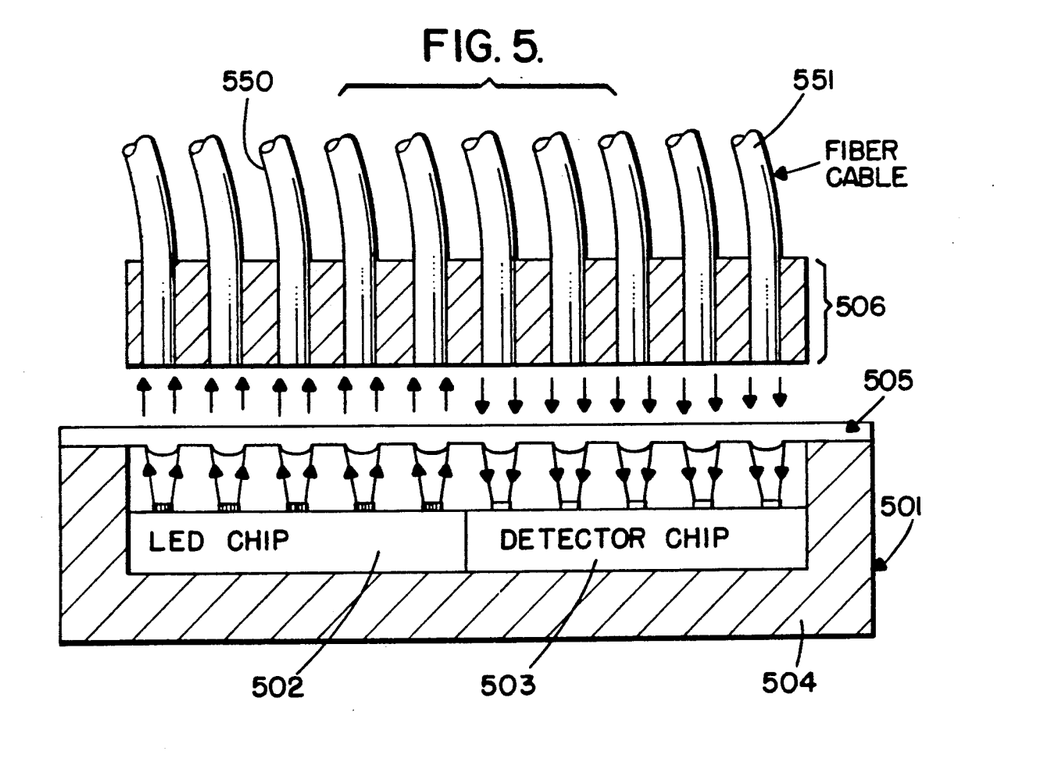
FIG. 5 depicts a remote optical connector (ROC) which may be plugged into a DOC to facilitate remote interconnections.

FIG. 5 depicts half of a DOC, unit 501, having an LED chip 502 and a detector chip 503 supported by base 504. A lenslet array, 505, is shown carried as part of DOC 501. A portion of a remote optical connector, 506, is shown comprised of an endplate, 507, for aligning and holding in place each of the depicted fibers of a multimode fiber optic cable, e.g., fiber 550, 551, etc., over a lenslet and light emitting (or detecting) element in DOC 501.

Utilizing this concept, any DOC half e.g., on a card or board, could be plugged either directly into its mating counterpart on a corresponding board or card, or alternatively into a ROC for remote interconnection.

Preferred spacing for the light emitting and light detecting elements in DOC 501 can be chosen based on the type of optical fiber used in ROC 506. For example, a 250 micron spacing would work well with the standard fiber optic cable referred to hereinbefore.

It should be apparent to those skilled in the art that ROCs comprised of the aforementioned endplates, fibers, etc., may be used in conjunction with DOCs incorporating imaging devices other then lenslets (examples of which are described in detail hereinafter) so long as the ROC fibers can be aligned and held in place over the light emitting and light detecting locations of the DOC.

The DOC and ROC described hereinbefore in the context of low speed applications can also be used for very high speed (Gbit/s range) applications if the receiver and LED are designed for very high data rates. For example, laser arrays could be used instead of LED arrays to facilitate high frequency modulation. IMSM-MESFET receivers could be used to accommodate high end (Gbits/s range) applications. The invention is not intended to be limited to the low speed applications discussed hereinbefore which were set forth for illustrative purposes only.

The DOC structure that includes lenslets as an imaging device, described in detail hereinbefore with reference to FIGS. 2-4, solves many of the problems associated with electromechanical connectors. However, an alternative connector structure is set forth hereinafter which relaxes the alignment constraints and improves on certain other shortcomings associated with a lenslet based energy transfer media. An example, of these shortcomings is that lenslets usually have a focal length of several hundred micrometers and as a result optical crosstalk can occur as the lenslets collect light from adjacent LEDs.

Figure 6:
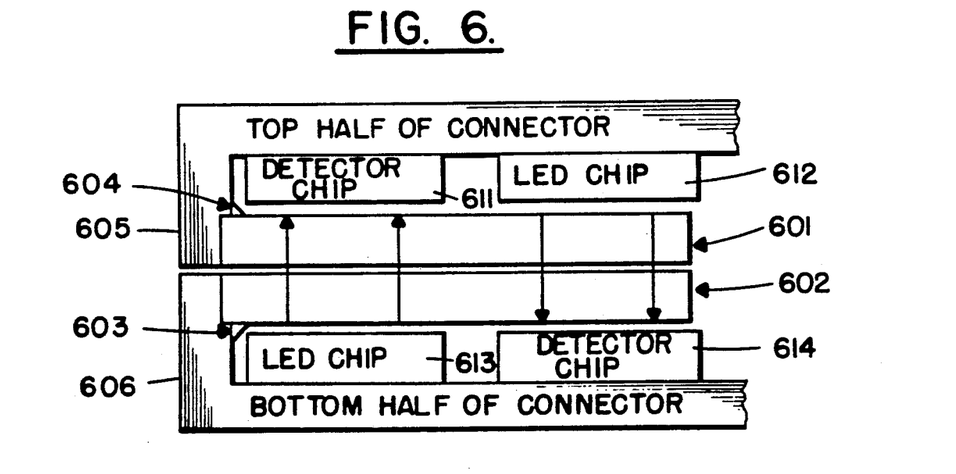
FIG. 6 depicts an embodiment of the invention in which each half of a DOC utilizes an imaging fiber plate (IFP) as an energy transfer medium.

An alternative embodiment of the invention which does not utilize lenslets and addresses the aforementioned shortcomings, is depicted in FIG. 6. FIG. 6 shows imaging fiber optic plates (IFPs) 601 and 602, typified by IFPs manufactured by Galileo Electro-optics Corporation, affixed to the body of the alternative connector structure immediately above the LED and detector arrays.

The IFPs can be affixed to the connector body by, for example, UV cure epoxy. The epoxy is shown in FIG. 6 disposed at locations 603 and 604. Other means of attachment such as "press bitting", soldering, thermally cured epoxy, etc. can be used. The top and bottom half of the connector are labeled 605 and 606 respectively. The detector chip array and LED chip array in top half 605 are labeled 611 and 612 respectively. The LED chip array and detector chip array in bottom half 606 are labeled 613 and 614 respectively.

Plates 601 and 602 typically consist of a fused assembly of step-index fibers which transmit light along the axis of the plate but prohibit light from scattering within the plane of the plate. Each fiber is typically less than 6 micrometers in diameter while the LED is typically on the order of 50 micrometers or greater. Because the plate can be affixed very close to the LEDs and detectors, more than 50% of the emitted light can be delivered to the detectors if two IFPs of Na of about 1 are used (such IFPs are commercially available).

Since the throughput is much greater than that of the lenslet scheme, the LED drive current can be reduced, thereby prolonging LED life and reducing on-chip electrical crosstalk.

Furthermore, since the fiber optic plate can be placed arbitrarily close to the emitters and detectors and transmits light only along the axis of the plate, optical crosstalk is greatly reduced from that of the lenslet scheme. Further yet, and of considerable significance, is the fact that the fiber optic plate need not be aligned to the LEDs and detectors because it consists of a continuous array of these small fibers. There is no need to align the individual fibers to the emitters and detectors. The image of the LEDs is directly transmitted to the corresponding array of detectors via these fibers. Thus, only the LED array need be aligned with the detector array, easing mechanical tolerances and greatly simplifying the manufacture of the optical interconnect package. It is also noted that the IFP protects the delicate transmitter and receiver chips from mechanical forces and atmospheric corrosive effects in the same manner as did the lenslet arrays, described above.

In addition to the advantages set forth hereinabove the IFP type of connector can easily be transformed into a remote connector by inserting a "flexible image conduit" between the two halves of the connector shown in FIG. 6. This type of fiber optic cable is also manufactured by Galileo Electro-optics Corp., and would consist of a flexible fiber-optic cable terminated at both ends with a fiber plate similar to those used in the connector. By butting one end of the flexible image conduit against the fiber plate which comprises one half of the connector, and by butting the opposite end of the flexible image conduit against the fiber plate of the remote connector half, a flexible parallel fiber optic link can be estalbished. Light emitted from the LEDs on one half of the connector would be transmitted along the cable by those fibers which happened to overlap each LED (with each fiber being much smaller than a LED). The light would then be transferred to the remote receivers, preserving the image and alignment of the LEDs and receivers, just as if the fiber plates in the original connection scheme had simply been thicker. Cables up to several meters or more in length are possible. The fiber cable insertion loss would only be on the order of 50%, and would require alignment tolerances similar to that required between each half of the fiber plate connector. However, it is noted that in certain applications, it may be preferable to employ the array of standard communication optical fibers previously described in connection with the lenslet embodiment of the DOC, based on cost and other factors.

The alternative embodiment of the invention depicted in FIG. 6 features ease of alignment (the fiber optic plate does not need to be aligned with anything although the opposing detectors and LEDs must still be aligned), low optical crosstalk and increased collection efficiency (higher optical throughput) compared with lenslet based DOCs, and is easily converted to a highly parallel, easily aligned remote connector.

Using IFPs as the energy transfer media in a DOC, the imaging efficiency or throughput can be expected to be such that more than 50% of the light emitted is imaged to the detectors. As for crosstalk, stray light imaged through two fiber plates falls off to less than 5% by 50 micrometers; hence, crosstalk is minimal and a pitch of approximately 75 micrometers is possible. No alignment of the imaging elements is needed since the fibers, as indicated hereinbefore, are typically less than 6 micrometers in diameter (and even as little as 3 micrometers in diameter) while the diameter of an LED is approximately 50 micrometers. Additionally, the IFP alternative is low in cost, highly stable (being fabricated using glass), hermetic and reliable.

While the aforestated features make the IFP approach to fabricating a DOC very attractive, there are still applications where it is important to accomplish objectives not readily attainable utilizing either IFPs or lenslets to fabricate a DOC. For example, there are applications where it is important to virtually eliminate the potential for crosstalk. It may also be important to reduce the cost by replacing the IFP by a less expensive device.

As indicated hereinbefore, IFPs permit approximately 50% transmission of light. A high proportion of this loss originates in the interstitial glass between the fibers, into which light can pass directly from the LED or by scattering from imperfections in the fibers. To prevent this light from leaving the exit side of the IFP, it is customary in imaging applications to coat each fiber with a thin absorbing layer (EMA, extra-mural absorber) or to fill a portion of the interstitial region with special light absorbing glass. This measure is necessary to prevent optical crosstalk; it would also be needed in many applications where certain embodiments of the invention could be used to suppress optical crosstalk.

Another alternative embodiment of the invention employs an "energy transfer fiber plate" (ETFP) constructed of fibers having the same (or slightly larger) diameter as that of the LEDs and the same (or slighly smaller) diameter as that of the detectors, as the DOC energy transfer media. This alternative DOC structure which includes an ETFP is depicted in FIG. 7.

Figure 7:
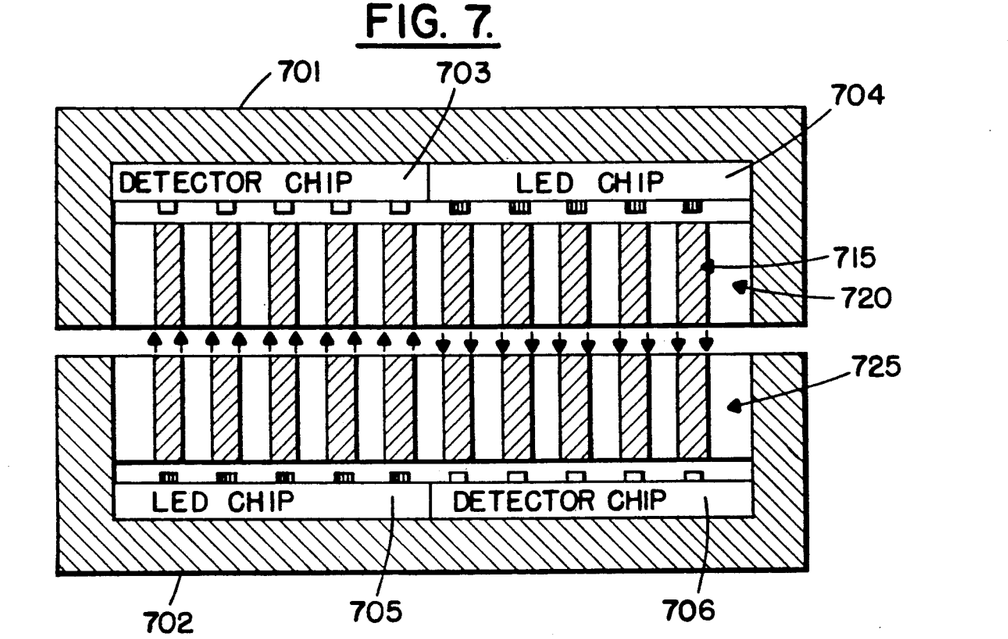
FIG. 7 depicts an embodiment of the invention in which each half of a DOC utilizes an energy transfer fiber plate (ETFP) as an energy transfer medium.

FIG. 7 shows the top and bottom half of a DOC where the support for the top half is labeled 701 and the support for the bottom half is labeled 702. The LED and detector chip arrays 703-706 in FIG. 7 correspond to arrays 611-614 respectively in FIG. 6.

Instead of an IFP being joined to each connector half, arrays of light guides (or waveguides), such as light guide 715, are shown included in ETFPs 720 and 725. Each light guide is aligned with an LED or detector as shown in FIG. 7.

Using an arrangement such as the one depicted in FIG. 7, arrays of fibers of the order of 50 to 100 micrometers in diameter would be required instead of the approximately 6 micron fibers used to fabricate an IFP. According to a preferred embodiment of the ETFP, step-index fibers could be used with a large difference between the core and cladding indices so that an NA of about 1 results. For NA of approximately 1, an index difference of about 20% may be used, as contrasted with a transmission fiber having an NA of about 0.2, which has an index difference of only about 1%.

A greater energy transfer efficiency than the IFP results because no light can enter the interstitial region directly from the LEDs, and because the proportion of imperfection caused scattering from the periphery into the interstitial region should be much less. The interstitial region in an ETFP can be very thick, on the order of 100 micrometers or more, as compared with the thin EMA coating of a micron or so. As a result of these factors crosstalk may be considerably reduced.

A tradeoff when using ETFPs versus IFPs is that the techniques used for fabrication of conventional IFPs are not easily adapted to fabricating ETFPs. This is because of the need for accurate positioning of the fibers. It may be possible to position fibers in a jig, then anchor them in place with a cement or frit glass. However, the ETFP might more easily be fabricated (at a lower cost) using specially made optical wave guides as an alternative to fiber glass. The array of wave guides could be formed from polymers on a suitable smooth hard substrate by techniques which are well known in the art (see F. Zernike "Fabrication and Measurement of Passive Components", Chapter 5 in Integrated Optics, T. Tamir, Editor (Springer Verlag, New York 1979)). A very effective method of fabricating the waveguide array needed for the ETFP may involve the use of photosensitive polymers which can be used with standard lithographic techniques to make step-index polymer optical guides as described in copending patent application Ser. No. 07/495,241, pending, filed Mar. 16, 1990, hereby incorporated by reference. The latter fabrication method offers the unique characteristic of nearly square cross section of the waveguides because of the high aspect ratios achievable thereby.

The characteristics of these waveguides are low loss (<0.3 dB/Cm), low crosstalk, high aspect ratio, and high environmental stability (optically clear up to 235 degrees C). Such waveguides offer all of the advantages of a glass-fiber based ETFP. In addition, they can be used to build substrate independent multilayer planar structures with the resolution and alignment tolerances obtained by standard lithography, thereby eliminating the problem of positioning and fixing of fibers into a jig. At the same time the optical waveguide ETFP provides a durable, protective coating for sensitive receiver and transmitter chips as well as their electrical interconnects.

Several schemes are possible for implementing such an ETFP based on optical waverguides. Suitably high numerical apertures (NA) can be obtained for example, by using epoxies (with refractive index ca. 1.6) as the light guiding region and methacrylates (with refractive index ca. 1.4). The polymer can be coated on a suitable substrate to the desired thickness and then be patterned. The patterned structures can then be diced or cleaved into the appropriate lengths. These patterned waveguide sections can then be placed "on edge" onto each half of the connector and serve as the ETFP.

An advantage of using waveguides in a DOC lies in the ability to taper the waveguides. A relatively narrow waveguide could be provided at the LED and detector interfaces, but the waveguide could taper to a larger diameter at the connector interface. By this means the alignment tolerance of half-connector to the mating half-connector could be substantially increased. Again, it is noted that the ETFPs protect the underlying transmitter and receiver chips by acting as a shield from mechanical impact and as a part of a hermetic seal.

The invention further contemplates the use of ROCs in conjunction with DOCs that include ETFPs. It is possible to fabricate the ROC, as indicated hereinbefore, using an array of communications fibers as previously described.

This embodiment of the invention, focusing on ROCs per se, contemplates fabricating the ROC from standard fiber optic transmission cable, such as fiber optic ribbons. Such an ROC would have the advantage of being compatible with the cable used in other data transmission applications. The aforementioned ribbons are commercially available, for example from AT&T, and are comprised of a linear array of connected flexible fibers on 250 micron centers, which can be purchased with from 2 to 96 fibers per ribbon.

The use of these multimode fibers would eliminate the potential for cable crosstalk. With appropriately powered LEDs, the fiber ribbons would permit transmission to distances of several tens of meters at several hundred Mbit/s. It is suggested, in those embodiments of the invention in which each half of a DOC contains an ETFP, that the ends of a ROC connector be made to mate specifically to the ETFPs.

Since optical waveguides can easily be designed so as to serve as fan-out structures, this form of ETFP would allow close spacing of optical devices (thereby minimizing cost) and suitable interface to fibers. These fibers can be the standard glass ribbon fibers referred to hereinabove, or plastic ribbon fibers which are suitable only for short distances because of their high attenuation, but are comparatively cheap.

Those skilled in the art will readily appreciate that advantages of the ETFP over the standard IFP are obtained at the price of the necessity of alignment. However, the required alignment can be achieved in applications where the ETFP and/or transmission cable are used.

For any of the previously described embodiments of the DOC, it will be necessary to provide mechanical alignment guides (for example, by pins in holes) so that the LEDs in one half of a DOC are in line with the detectors of the other half of the DOC. It is therefore desirable to provide an alignment scheme which keys the position of the LEDs and detectors to these mechanical alignment guides.

A simple scheme for such alignment is set forth hereinafter, which can easily be extended to the alignment of the ETFP, is based on the principles of the alignment of fiducial marks (the principles of the alignment of fiducial marks for passive laser-fiber alignment are set forth in copending application Ser. No. 542,271, pending, filed 6/22/90, hereby incorporated by reference).

The alignment scheme referred to assumes that each half of a DOC includes a base (like base 702 in FIG. 7), which houses the LED and detector chips (like chip 705 and 706 in FIG. 7), and a cover, which houses the energy transfer medium, for example, an ETFP. It is further assumed that the cover and the base are each furnished with two precision bored holes which can be fitted with alignment pins for precision alignment of the two parts.

These pins may be used only temporarily during alignment, and withdrawn afterwards. When the alignment procedure is finished for each half DOC, the cover and base can be bonded together (by screws, cement, etc.). It should be noted that the same holes may subsequently be used to ensure proper alignment of the two halves of a (completely fabricated) DOC during plugging and unplugging operations.

During the alignment procedure for each half of a DOC, the LED and receiver chips are first placed in the base and readied for bonding to it. Then a glass alignment plate having special fiducial marks is used. Such fiducial marks could, for example, be made so that when the alignment plate is in proper juxtaposition to an LED or detector chip, a fiducial mark would circumscribe each active element, i.e., each active LED or sensor region. A complete alignment jig consists of an alignment plate mounted in a housing having two holes corresponding to the alignment holes in the base and cover. Using pins in the corresponding holes of the alignment jig and the base, the alignment jig is lowered until its fiducial marks are essentially in contact with those on the chips, and the chips are then maneuvered until their active areas line up as viewed with a microscope. The chips can then be bonded, e.g., with epoxy or solder. Those skilled in the art will readily appreciate that this procedure may be used no matter which energy-transfer medium is used.

ETFP alignment can be carried out in a similar manner. The ETFP is first loosely positioned in the cover of a given half DOC. An alignment jig is then put into juxtaposition with the cover using alignment pins, and the ETFP is then manipulated into position so that the fiducial marks on the alignment plate line up with the waveguides (or fibers) on the ETFP. The ETFP is then bonded to the cover with a suitable cement.

In the final operation, the cover is bonded to the base of each half DOC, again using alignment pins. Each half DOC of each connector is aligned in a similar fashion, thereby guaranteeing complete alignment of LED-to-detector when an IFP is used, and LED-to-waveguide-to-detector when an ETFP is used.

These operations may be carried out under robotic control, using pattern recognition techniques. In this case the fiducial marks may be stored in computer memory as "soft" fiducial marks, so that the manipulation of a physical alignment jig is not necessary.

For the ROC used in conjunction with an EFTP DOC half, it is necessary to construct a connector which mechanically aligns to the DOC half in such a fashion that the fibers in the cable are in the correct position relative to the waveguides (or fibers) in the ETFP. Here, it is assumed that a "ribbon" cable of fibers is used. Such ribbons are commercially available (e.g. Corning Glass Works) and consist of a multiplicity of individual fibers which are in a single row, packed side by side. Since the outside jacket diameter of the individual fibers are tightly controlled, and since the fibers are tightly packed, jacket-to-jacket, the center-to-center spacing is also well controlled (typically 250 micrometers). (See M. J. Saunders and W. L. Parham, Bell System Technical Journal, Vol. 56, P. 1013-1014 (1977)). The fabrication could, for example, proceeds as follows: The stripped ends of the fibers of the ribbons comprising the fiber cable are first inserted into holes in a special jig. All the fibers are then fixed in place by potting them in a suitable plastic. A ROC housing with preattached alignment pins is then bonded to the potted fibers, using holes in the same jig for positioning of those pins. It should be noted that the alignment tolerances needed here are on the order of about 10 micrometers; this is in contrast with tolerances of 1 micrometer which are required for laser-single mode fiber alignment.

The ROC could be used within equipment where flexibility is required, e.g., for connecting print heads or recording heads to driver devices in printers and disk drive assemblies.

Suppose now it is desired to use not fiber ribbons, but a collection of individual fibers for the ROC. For this purpose, another embodiment of the invention contemplates the use of a locating plate to attach and align optical fibers for applications where a number of fibers are used in parallel, e.g., for ROCs and sensors. In particular, a method will be described hereinafter for making an array of fibers held rigidly at each end of a long bundle, but flexible in between, and for aligning the array to a device or fiberplate at each end.

The method contemplated by this alternative embodiment of the invention involves making an ROC out of a flexible array of fibers which is held rigidly at each end of the bundle by, for example, an endplate. The process involves aligning of the array of fibers with the light emitting and light detecting locations in the connectors mating with each end of the ROC. The process comprises the steps of (1) punching an endplate for the ROC to provide locating holes into which the fibers can be inserted; (2) inserting the fibers into the locating holes; and (3) holding the fibers in place to form an endplate where the fibers are aligned with the light emitting and light detecting locations in the device to which the ROC is to be connected.

After insertion, the fibers could be held in place by quick curing or UV curing epoxy glue, and later given a more permanent fixation. Assembly could be carried out with the endplate held to a polished surface, giving good vertical alignment of the fibers, which would be precut to have flat, smooth ends for optical interfacing. For sensor and printhead or recording head interconnections, the overall number of fibers would be modest, of order 16-20, so that assembly by hand using a micromanipulator should be relatively fast. For device interconnection, where 100 or more fibers would be needed, an automated assembly process is contemplated.

After assembly of the endplates, the flexible portion of the cable would be suitably packaged (e.g., in a flexible sleeve of polymeric material) and the ends could be mounted as desired. They could be permanently cemented to a chip with exposed detectors and/or LEDs using UV cure epoxy, after location by means of fiducial marks on the endplate and chip. In certain applications, it would be desirable for the inner face of the endplates to be coated with a light absorbing surface layer to minimize scattering of stray light. Attachment to a fiberplate could be accomplished via the fiducial mark on the chip below the plate being imaged at the top of the plate. This image could be used for alignment to the chip below. For removable attachment, the endplate could be supplied with a precision molded lip, much like the lip on a freezer container, during the injection molding process. The punched holes would be located with respect to this lip, and the fiberplate, ground to match the lip, would be located on the chip and attached, so that the endplate would have the proper alignment when snapped on. This would be particularly useful for assembly and rework of area array connectors.

Figure 8:
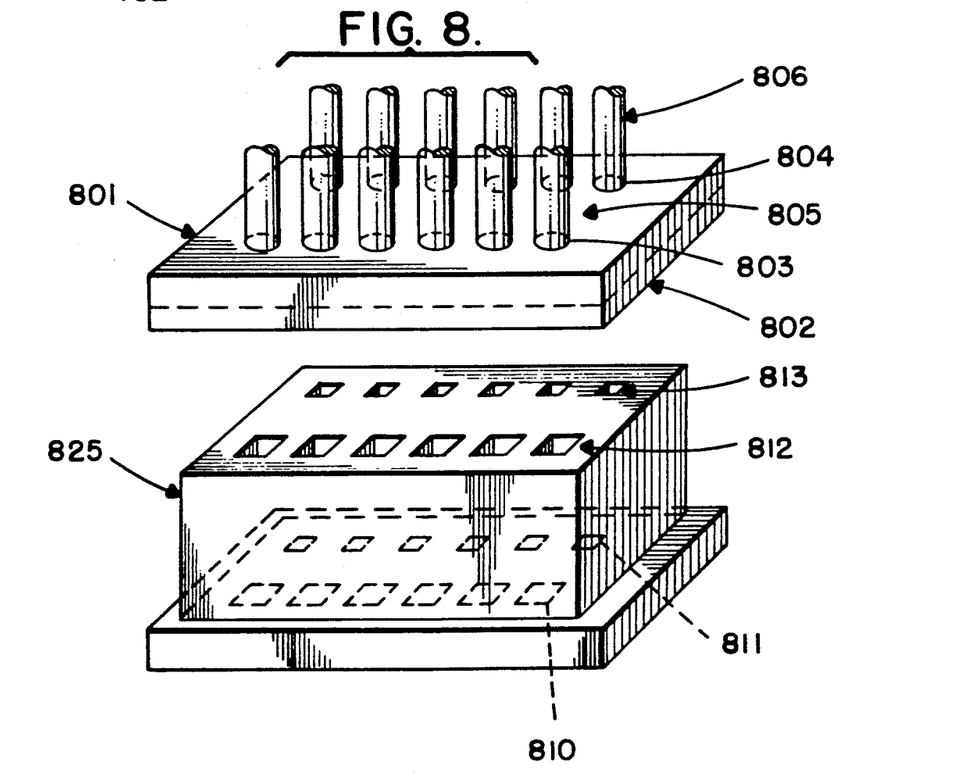
FIG. 8 depicts a locating plate which, according to one aspect of the invention, may be used to attach optical fibers after aligning them with the light imaging elements, such as lenslets, IFPs or ETFPs, in DOCs fabricated in accordance with the teachings set forth hereinafter.

FIG. 8 depicts the assembly contemplated by this aspect of the invention. In particular, FIG. 8 depicts endplate 801, locating lip 802, and a plurality of openings (for example, openings 803 and 804) for holding and aligning fibers (like fibers 805 and 806) over the light emitting and light detecting locations 810 and 811. The images for devices 810 and 811 are shown at 812 and 813 respectively, and appear at the top of fiberplate 825.

Alternate embodiments of the invention contemplate the use of other alignment means, for example, a sliding mechanism or pins, instead of or in addition to locating lip 802, to properly position endplate 801 over a sensor or energy transfer device (for example, lenslet array, fiberplate, etc.).

Endplates like endplate 801, can be manufactured from polyimides, silicone, epoxies, or thin metal sheets; in principle, any sheet material with suitable properties could be used, so long as the material is chosen to match parameters of the substrate (e.g. thermal coefficient of expansion).

The holes can be punched or drilled. Equipment is commercially available to do this with the required accuracy on a manufacturing basis. In fact, one alternative is to hold all the fibers in a jig plate with appropriate holes, heat up the bottom of the fibers, and punch the polymeric sheets using the hot fibers as punches. If the outer surface of the fibers can be coated with a heat activated adhesive, this would provide punching, insertion, and retention in a single step. After this step, the bottom of the fibers would be polished to expose the optical material. For metal layers, punching would be preferable because of cost, reliability, and ease of operation. Several plates could be overlaid and gang punched at the same time, aiding in registration of a connector assembly. To aid in fiber insertion, conical punches, drills, or chemical etching can be used. In fact, holes can be patterned using standard photoresist techniques and etched for some applications. A further method of manufacture would be molding, in which the holes would be provided by cores in the master mold. For some applications, plastic injection molding might have sufficient accuracy.

What has been described are methods, apparatus and manufacturing processes meeting all of the objectives set forth hereinbefore. Those skilled in the art will recognize that the foregoing description has been presented for the purposes of illustration and description only. It is not intended to be exhaustive or to limit the invention to the precise form disclosed, and obviously many modifications and variations are possible in light of the above teaching. For example, light modulating devices, such as spatial light modulators, may be used in placed of light emitting devices within all of the interconnect structures described hereinbefore without departing from the spirit or scope of the invention.

The embodiments and examples set forth herein were presented in order to best explain the principles of the instant invention and its practical application to thereby enable others skilled in the art to best utilize the instant invention in various embodiments and with various modifications as are suited to the particular use contemplated.

What is claimed is:

1. A direct optical connector for transmitting and receiving electrically transmitted data, comprising:
   (a) a first member that includes an array of light emitting devices fabricated on a single chip;
   (b) a second member, adapted for reclosable connection with said first member, that includes an array of light detecting devices fabricated on a single chip that are each aligned with a corresponding light emitting device in said array of light emitting devices to form a first plurality of adjacent device pairs having all light emitting devices on said first member and all light detecting devices on said second member whenever said first and second member are connected; and
   (c) an energy transfer media interposed between the devices in each pair of devices in said first plurality of adjacent device pairs to form an optical communication channel between the devices in each pair, wherein said media is comprised of an array of non-reflective lenslets which are used for imaging light between the devices in each device pair using air as the propagation medium.

2. Apparatus as set forth in claim 1 wherein said first member further comprises an array of light detecting devices fabricated on a single chip; wherein said second member further comprises an array of light emitting devices fabricated on a single chip that are each aligned with a corresponding light detecting device in said array of light detecting devices included in said first member to form a second plurality of adjacent device pairs having all light emitting devices on said second member and all light detecting devices on said first member whenever said first and second member are connected and wherein said energy transfer media is further comprised of one additional non-reflective lenslet, in said array of lenslets, for each device pair in said second plurality of device pairs such that each additional non-reflective lenslet is interposed between the devices of one device pair of said second plurality of adjacent device pairs to form an optical communication channel therebetween.

3. Apparatus as set forth in claim 2 wherein said array of non-reflective lenslets is carried as part of the structure of one of said first and second members.

4. Apparatus as set forth in claim 2 wherein said array of non-reflective lenslets includes a lenslet doublet.

5. Apparatus as set forth in claim 4 wherein one half of said doublet is carried on each of said first and second members with the plane of seperation between each half of said doublet being positioned so as to align the lenslets on each half when said first and second members are connected.

6. Apparatus as set forth in claim 1 wherein each light emitting device in said array of light emitting devices is comprised of a light emitting diode (LED).

7. Apparatus as set forth in claim 1 wherein each light detecting device in said array of light detecting devices is comprised of a combination preamplifier and receiver.

8. Apparatus as set forth in claim 1 further comprising at least one non-reflective aperture array interposed between said array of light emitting devices and said energy transfer media.

9. Apparatus as set forth in claim 1 further comprising at least one aperture array included as part of said energy transfer media.

10. A direct optical connector for transmitting and receiving electrically transmitted data, comprising:
 (a) a first member that includes an array of light emitting devices fabricated on a single chip;
 (b) a second member, adapted for reclosable connection with said first member, that includes an array of light detecting devices fabricated on a single chip that are each aligned with a corresponding light emitting device in said array of light emitting devices to form a first plurality of adjacent device pairs having all light emitting devices on said first member and all light detecting devices on said second member whenever said first and second member are connected; and
 (c) an energy transfer media interposed between the devices in each pair of devices in said first plurality of adjacent device pairs to form an optical communication channel between the devices in each pair, wherein said media is comprised of an array of optical imaging fiber bundles wherein each fiber bundle is comprised of a plurality of optical imaging fibers forming a direct optical connection between a given pair of devices in said first plurality of adjacent device pairs, and further wherein the diameter of each fiber is small enough to permit its ends to be positioned against the devices of a given device pair without alignment.

11. Apparatus as set forth in claim 10 wherein said first member further comprises an array of light detecting devices fabricated on a single chip; wherein said second member further comprises an array of light emitting devices fabricated on a single chip that are each aligned with a corresponding light detecting device in said array of light detecting devices included in said first member to form a second plurality of adjacent device pairs having all light emitting devices on said second member and all light detecting devices on said first member whenever said first and second member are connected; and wherein said energy transfer media is further comprised of one additional optical imaging fiber bundle, in said array of optical imaging fiber bundles, for each device pair in said second plurality of adjacent device pairs such that each additional fiber bundle is interposed between the devices of one device pair of said second plurality of device pairs to form an optical communication channel therebetween.

12. Apparatus as set forth in claim 11 wherein said array of optical imaging fiber bundles is fabricated as a fused imaging fiber plate (IFP).

13. Apparatus as set forth in claim 12 wherein said IFP is carried as part of the structure of one of said first and second members.

14. Apparatus as set forth in claim 12 wherein said IFP is fabricated in two parts with the first part of said IFP being carried as part of the structure of said first member and with the second part of said IFP being carried as part of the structure of said second member.

15. Apparatus as set forth in claim 10 wherein each light emitting device in said array of light emitting devices is comprised of a light emitting diode (LED).

16. Apparatus as set forth in claim 10 wherein each light detecting device in said array of light detecting devices is comprised of a combination preamplifier and receiver.

17. A direct optical connector for transmitting and receiving electrically transmitted data, comprising:
 (a) a first member that includes an array of light emitting devices fabricated on a single chip;
 (b) a second member, adapted for reclosable connection with said first member, that includes an array of light detecting devices fabricated on a single chip that are each aligned with a corresponding light emitting device in said array of light emitting devices to form a first plurality of adjacent device pairs having all light emitting devices on said first member and all light detecting devices on said second member whenever said first and second member are connected; and
 (c) an energy transfer media interposed between the devices in each pair of devices in said first plurality of adjacent device pairs to form an optical communication channel between the devices in each pair, wherein said media is comprised of an array of waveguides that are each aligned with a given pair of devices in said first plurality of adjacent device pairs forming a direct optical connection therebetween.

18. Apparatus as set forth in claim 17 wherein said first member further comprises an array of light detecting devices fabricated on a single chip; wherein said second member further comprises an array of light emitting devices fabricated on a single chip that are each aligned with a corresponding light detecting device in said array of light detecting devices included in said first member to form a second plurality of adjacent device pairs having all light emitting devices on said second member and all light detecting devices on said first member whenever said first and second member are connected; and wherein said energy transfer media is further comprised on one additional waveguide, in said array of waveguides, for each device pair in said second plurality of adjacent device pairs such that each additional waveguide is interposed between the devices of one device pair of said second plurality of adjacent device pairs to form an optical communication channel therebetween.

19. Apparatus as set forth in claim 18 wherein each waveguide is photolithographically defined.

20. Apparatus as set forth in claim 18 wherein a plurality of said waveguides are fabricated as an energy transfer fiber plate (ETFP).

21. Apparatus as set forth in claim 20 wherein said ETFP is carried as part of the structure of one of said first and second members.

22. Apparatus as set forth in claim 21 wherein said ETFP is fabricated in two parts with the first part of said ETFP being carried as part of the structure of said first member and with the second part of said ETFP being carried as part of the structure of said second member.

23. Apparatus as set forth in claim 17 wherein each light emitting device in said array of light emitting devices is comprised of a light emitting diode (LED).

24. Apparatus as set forth in claim 17 wherein each light detecting device in said array of light detecting devices is comprised of a combination preamplifier and receiver.

25. A direct optical connector (DOC), comprising first and second members, each including a plurality of light emitting and light detecting locations fabricated as homogeneous array structures on individual chips, operative in combination with non-reflective energy transfer media to form direct optical connections between the light emitting locations and the light detecting locations, wherein said first and second members are adapted for reclosable connection to each other whereupon the light emitting locations on one member are aligned with the light detecting locations on the other member.

26. Apparatus as set forth in claim 25 wherein said first and second members are modular and functionally interchangeable.

27. Apparatus for transmitting and receiving light for purposes of electronic data communication, comprising:
   (a) an array of light emitting devices fabricated on a single chip;
   (b) an array of light detecting devices fabricated on a single chip;
   (c) a support member having said array of light emitting devices and said array of light detecting devices mounted thereon; and
   (d) a non-reflective energy transfer media, combined with said support member and disposed over the arrays mounted thereon, to transmit light emitted by said light emitting devices and to focus light onto said light detecting devices.

28. Apparatus as set forth in claim 27 wherein said energy transfer media further comprises an array of non-reflective lenslets.

29. Apparatus as set forth in claim 27 wherein said energy transfer media further comprises a fused imaging fiber plate (IFP).

30. Apparatus as set forth in claim 27 wherein said energy transfer media further comprises an energy transfer fiber plate (ETFP).

31. Apparatus as set forth in claim 27 wherein said array of light emitting devices is made up of light emitting diodes (LEDs).

32. Apparatus as set forth in claim 27 wherein said array of light detecting devices are each formed as a combination of a preamplifier and a receiver.

33. Apparatus as set forth in claim 27 further comprising means for channelling light to and from remote locations, wherein said means for channelling light is juxtaposed with said energy transfer media to form a remote optical connector (ROC) having the same footprint as the array structure supported by said support member.

34. A process for manufacturing a remote optical connector (ROC) from a flexible array of fibers, for use in combination with apparatus for transmitting and receiving light, wherein said apparatus comprises an array of light emitting devices, an array of light detecting devices, a support member having said array of light emitting devices and said array of light detecting devices mounted thereon, and an energy transfer media, combined with said support member and disposed over the arrays mounted thereon, to transmit light emitted by said light emitting devices and to focus light onto said light detecting devices, comprising the steps of:
   (a) punching an endplate to provide locating holes into which said fibers can be inserted, wherein each hole is punched in line with one of said light emitting devices or one of said light detecting devices;
   (b) inserting said fibers into said locating holes; and
   (c) affixing to said endplate, the fibers inserted according to step (b), to form a rigid endplate/fiber combination that aligns each of said fibers with one of said emitting or detecting devices when the combination is coupled to said apparatus for transmitting and receiving light.

35. A process as set forth in claim 34 further comprising the step of fabricating a mating lip on the edges of said endplate for coupling the ROC to said apparatus for transmitting and receiving light.

36. A remote optical connector (ROC), for use in combination with apparatus for transmitting and receiving light, wherein said apparatus comprises an array of light emitting devices fabricated on a single chip, an array of light detecting devices fabricated on a single chip, a support member having said array of light emitting devices and said array of light detecting devices mounted thereon, and a non-reflective energy transfer media, combined with said support member and disposed over the arrays mounted thereon, to transmit light emitted by said light emitting devices and to focus light onto said light detecting devices, comprising:
   (a) means for channelling light between said apparatus for transmitting and receiving light and a remote location wherein said means for channelling light has the same footprint as said means for transmitting and receiving light;
   (b) means for aligning said means for channelling with said light emitting and light detecting devices;
   (c) means for affixing said means for channelling to said means for aligning; and
   (d) means for combining said means for aligning with said energy transfer media.

37. Apparatus as set forth in claim 36 wherein said means for channelling comprises an array of flexible bundles of imaging fibers.

38. Apparatus as set forth in claim 36 wherein said means for channelling comprises an array of waveguides.

39. Apparatus as set forth in claim 36 wherein said means for aligning comprises an endplate including at least one opening into which said means for channelling can be inserted and held in place.

40. Apparatus for transmitting and receiving light comprising:
   (a) an array of light modulating devices fabricated on a single chip;
   (b) an array of light detecting devices fabricated on a single chip;
   (c) a support member having said array of light modulating devices and said array of light detecting devices mounted thereon; and
   (d) a non-reflective energy transfer media, combined with said support member and disposed over the arrays mounted thereon, to transmit light emitted by said light emitting devices and to focus light onto said light detecting devices.

* * * * *